United States Patent [19]

Burwell

[11] Patent Number: 4,982,109

[45] Date of Patent: Jan. 1, 1991

[54] CIRCUIT AND METHOD FOR MEASURING THE DURATION OF A SELECTED PULSE IN A PULSE TRAIN

[75] Inventor: William J. Burwell, Ottawa, Ohio

[73] Assignee: Westinghouse Electric Corp., Pittsburgh, Pa.

[21] Appl. No.: 417,230

[22] Filed: Oct. 4, 1989

[51] Int. Cl.[5] .................... H03K 5/22; H03K 3/017; H03K 21/00; H03K 21/38

[52] U.S. Cl. .................... 307/265; 307/234; 328/111; 377/44; 377/107

[58] Field of Search ............... 377/19, 44, 49, 107, 377/112, 118; 307/234, 265; 328/111

[56] References Cited

U.S. PATENT DOCUMENTS

| | | | |
|---|---|---|---|
| 4,443,842 | 4/1984 | Jessee | 363/41 |
| 4,504,899 | 3/1985 | Jessee | 363/56 |
| 4,627,075 | 12/1986 | Fleming, III et al. | 307/234 |
| 4,675,597 | 6/1987 | Hernandez | 307/234 |
| 4,870,664 | 9/1989 | Hayashi | 377/44 |

Primary Examiner—Timothy P. Callahan
Attorney, Agent, or Firm—R. P. Lenart

[57] ABSTRACT

A method of measuring the duration of a selected pulse in a pulse train produces a pulse count enable logic signal in response to a start pulse to enable a first down counter to count transition points in the pulse train. The pulse count enable logic signal has a duration at least as long as two sequences of pulses in the pulse train. The first down counter counts down from a predetermined initial count representative of the selected pulse in the pulse train and enables a second counter when the count corresponding to that selected pulse is reached. The second counter is used to count high speed clock pulses until the end of the selected pulse in the pulse train. The final output count of the second counter is then used to calculate the duration of the selected pulse.

8 Claims, 2 Drawing Sheets

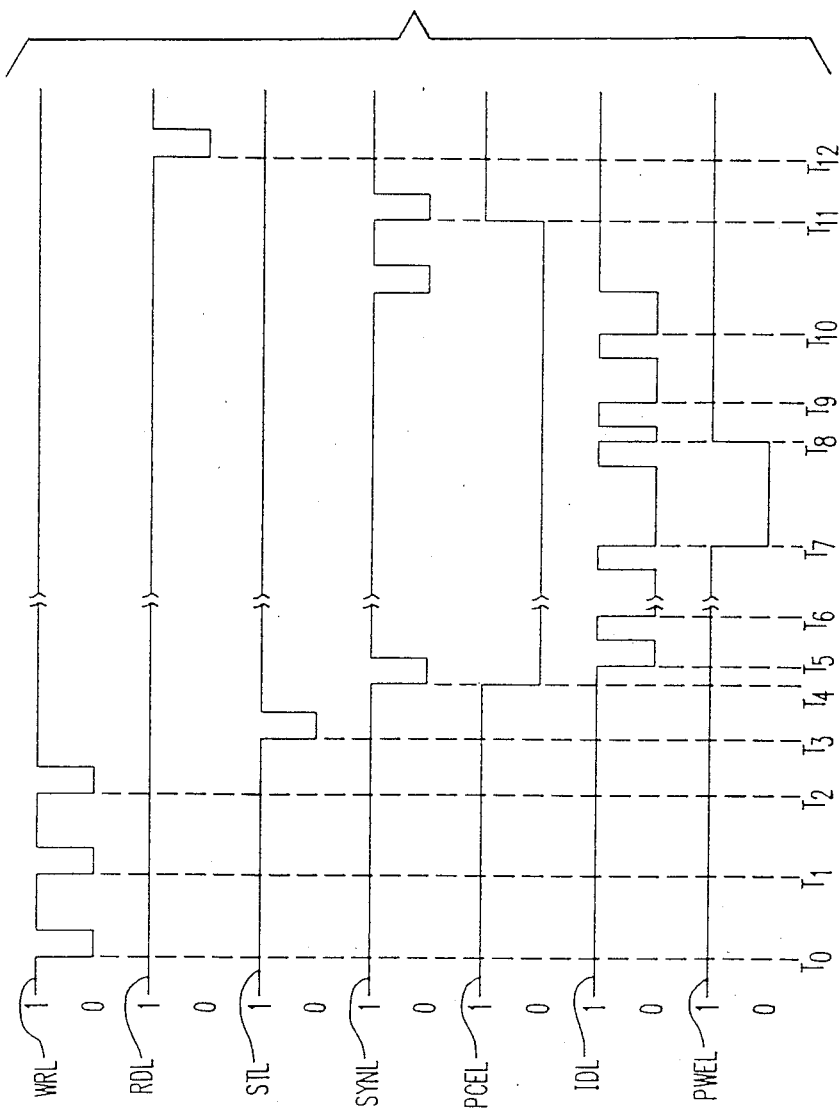

CIRCUIT AND METHOD FOR MEASURING THE DURATION OF A SELECTED PULSE IN A PULSE TRAIN

BACKGROUND OF THE INVENTION

This invention relates to the measurement of the duration of voltage pulses in electronic circuits and, more particularly, the duration of a selected pulse in an inverter drive logic pulse train.

Electronic inverters which convert DC voltage to a constant frequency AC output incorporate waveform generating circuits which drive power transistors to produce a quasi sine wave which is filtered to produce a sine wave output. A typical waveform pattern that is used to switch the output power poles of an inverter to produce a quasi sine wave of low harmonic content that can be easily filtered, may include four waveform patterns for each output phase. Two of the waveform patterns would be used to switch a positive semiconductor switch on and off respectively, while the other two waveform patterns would be used to switch a corresponding negative semiconductor switch on and off. Each of the waveforms may include 18 edges. Thus a three phase system may require 216 pulse edges. The relationship between these pulse edges is critical. An error of several microseconds can degrade performance to an unacceptable level. The affected performance parameters are total harmonic content and direct current content. Thus to assure that the circuit is operating properly, a test must be performed on each unit produced to determine that the waveforms have the proper pulse edge relationships.

Various methods have been used to determine if the waveform generating circuit is operating properly. At the printed wiring board level, the waveforms may be examined with an oscilloscope. This is a time consuming task which is prone to error. At the line replaceable unit level, the average DC voltage level may be measured. However, this approach does not produce results of sufficient accuracy since a one percent difference in the average voltage can result in more than doubling of the harmonic content. An alternative approach is to test a complete system in a closed loop configuration by measuring the DC content and harmonic content of the output. This is also a costly and time consuming procedure.

In order to reduce testing time and obtain improved test data, an electronic pulse width measurement circuit was constructed. That circuit responds to a synchronization pulse provided by the inverter drive control circuit and counts pulse edges until the pulse of interest in encountered. A timer is enabled only during the pulse of interest and the output of the timer is subsequently read by a microprocessor. These functions are accomplished by loading a register with the requested pulse number and counting each inverter drive logic pulse up from zero. A four bit magnitude comparator compares the count with the register's pulse number. When the counts are equal, a high speed timer is enabled. On the next inverter drive logic pulse, the timer is disabled. The high speed timer count represents the width of the specified pulse.

The previous circuit is limited by the use of a four bit comparator, such that at most, 15 pulses can be counted after the sync pulse. Furthermore, that circuit requires the use of a separate counter, register, comparator, arming logic and a high speed timer.

It is desired to provide an improved electronic pulse width measurement circuit which requires less printed wiring board space, can be constructed at a lower cost, and permits the counting of a larger number of pulses than the previous circuit design.

SUMMARY OF THE INVENTION

The present invention achieves the above objectives by providing a method of measuring the duration of a selected pulse in a pulse train which includes the steps of loading a first down counter with a first initial count, loading a second down counter with a second initial count representative of a selected pulse in the pulse train, and loading a third down counter with a third initial count. A series of sync pulses are applied to the first counter, the pulse train is supplied to the second counter, and a high speed clock signal is applied to the third counter. A start pulse applied to the first counter arms it as a one shot which activates when a first sync pulse is received. This activation enables the second counter to count pulse edges in a pulse train. When the selected pulse is reached, the corresponding output of the second counter enables the third counter to count pulses in the high speed clock signal. After the output of the second counter goes beyond the output corresponding to the selected pulse, the third counter stops counting clock pulses and the output count of the third counter is representative of the duration of the selected pulse.

The three counters used to perform the pulse width measurement technique described above, may be implemented by a single commercially available integrated circuit, thereby providing parts count, cost and reliability improvements over the previous measurement technique. In the preferred embodiment, the first counter is configured as a one shot circuit to produce a pulse count enable logic signal that controls the operation of the second counter.

BRIEF DESCRIPTION OF THE DRAWINGS

The present invention will become more readily apparent from the following description of the preferred embodiment thereof, shown by way of example only, in the accompanying drawings wherein:

FIGS. 2 and 3 show a series of waveforms which are used to explain the operation of the circuit of FIG. 1.

DESCRIPTION OF THE PREFERRED EMBODIMENT

Figure 1:
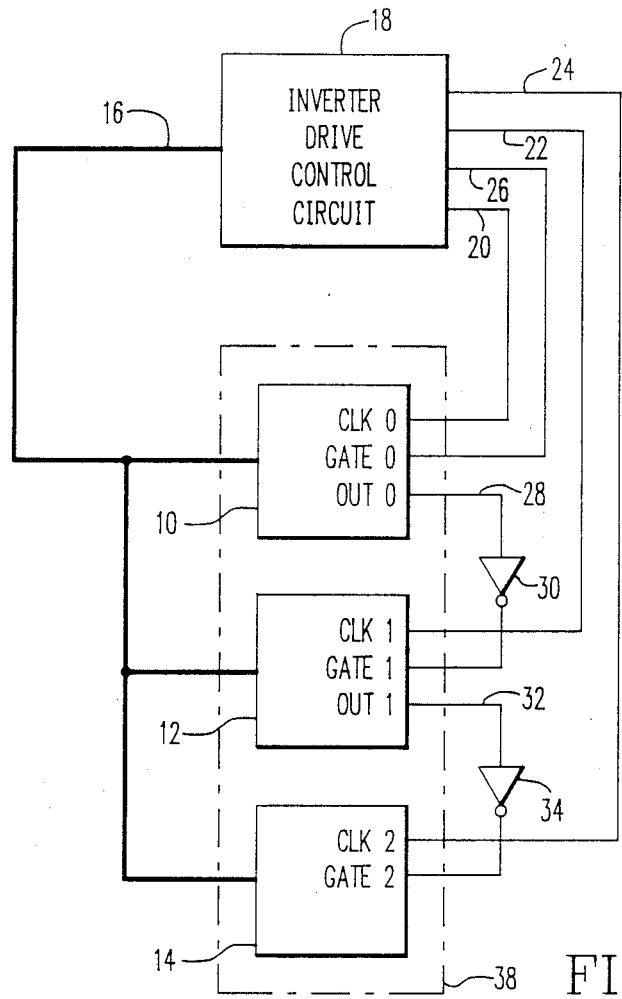
FIG. 1 is a block diagram of a circuit constructed in accordance with the preferred embodiment of the present invention.

Referring to the drawings, FIG. 1 is a block diagram of a circuit for measuring the duration of a selected pulse in a pulse train, such as an inverter drive logic pulse train. The circuit includes first, second and third counters 10, 12 and 14 respectively, which receive various logic signal inputs via data bus 16 from an inverter drive control circuit 18. The inverter drive control circuit is part of an inverter system which is being tested and contains a microprocessor which supplies data to, and controls the operation of, the three clock circuits to perform the measurement method of this invention. In that capacity, the inverter drive control circuit serves as a control means for loading the first counter 10 with a first predetermined initial count N; for loading the second down counter 12 with a second predetermined initial count representative of a selected pulse in an inverter drive logic signal, the duration of which is to be measured; and for loading the third down counter with a third predetermined initial count, which in the preferred embodiment is the maximum count of the third counter. The inverter drive circuit also supplies inverter drive sync pulses to the first counter via line 20 and inverter drive logic signal pulses to the second counter via line 22. The microprocessor provides a high speed clock signal to the third counter via line 24.

In the preferred embodiment, the inverter drive sync signal is a high to low transition during the 18th inverter drive logic pulse. The next high to low transition of the inverter drive logic signal is defined as the beginning of pulse No. 1.

A start pulse STL is supplied on line 26 to enable the first counter to count pulses in the sync signal SYNL. The first high to low transition on the sync signal SYNL, after the start pulse STL, produces a pulse count enable signal PCEL on line 28. This signal is inverted by an inverter 30 and supplied to the gate input of counter 12. This enables counter 12 to count pulse edges in the inverter drive logic signal IDL supplied by the inverter drive control circuit 18 via line 22. When the second counter 12 reaches a predetermined output, which is zero in the preferred embodiment, it produces a pulse width enable signal PWEL on line 32 which is inverted by inverter 34 and serves to enable counter 14 to count the high speed clock pulses supplied via line 24. After the output of counter 12 goes beyond its predetermined output count, counter 14 stops and its output count is representative of the duration of the selected pulse in the inverter drive logic signal This output count can then be read via data bus 16 and the duration of the selected pulse can be easily calculated by the microprocessor in the inverter drive control circuit 18. In the preferred embodiment, counters 10, 12 and 14 are all contained in a single, commercially available 82C54 programmable interval timer 38.

In the preferred embodiment of FIG. 1, counter 10 serves as a hardware/software synchronization circuit for arming and disarming the rest of the measurement circuit. Hardware/software synchronization refers to the fact that the inverter drive sync signal is a function of the inverter drive logic hardware circuit and the start pulse, STL, is produced via a set of software instructions. These two signals are unrelated, and therefore asynchronous, and require synchronization by counter 10. Counter 12 serves as a pulse counting circuit and counter 14 serves as a pulse width measurement circuit. Counter 10 is employed as a one shot to allow hardware/software synchronization. This eliminates the need for SR flip flop circuits which were used to arm and disarm the previous pulse width measurement circuit. When configured as a one shot, the output of counter 10, on line 28, is activated when the first sync pulse following the start pulse is received. The output of counter 10 remains active until enough sync pulses are received for counter 10 to count down below zero. In the preferred embodiment N=2, the output of counter 10 is active during "range" of counts from 2 down through zero. Counter 12 is used as a down counter to output a pulse when it reaches a zero count. This contrasts with the previous measurement circuit which used an upcounter and a comparator to perform the same function. Both the present invention and the previous measurement circuit use a counter to provide the pulse width measurement function by counting a high speed clock signal during the selected pulse. In the preferred embodiment, counter registers which are internal to the 82C54 circuit, replace the external pulse count register used in the previous measurement circuit. Each counter register is an integral part of one counter stage of the 82C54. The counter register holds the count for that counter stage.

In the preferred embodiment of FIG. 1, counter 14 is configured in the "interrupt on terminal count mode". In this implementation, the terminal count (zero) should never be reached. This counter is enabled by the output of the pulse count counter 12. In the preferred embodiment, counter 14 is clocked by a 3.07 megahertz clock signal. During the specified pulse, that counter counts down from its maximum count level, FFFF in hexadecimal notation, at a 3.07 megahertz rate. After sending the start pulse to counter 10, the microprocessor in the inverter drive control circuit 18 waits for a minimum of three sync periods, at which time, counter 14 will contain the pulse width value. The microprocessor can then calculate the pulse duration according to the following formula:

$$T = (2\text{'s Complement of Counter 14})/(3.07 \text{ MHz})$$

where T is the pulse width.

The operation of the circuit of FIG. 1 can now be explained with reference to the waveforms of FIGS. 2 and 3. To initiate the measurement cycle, a write signal WRL is supplied via data bus 16 to counters 10, 12 and 14. At time $T_0$, the first pulse in the write signal loads the pulse width counter 14 with its predetermined initial count, which in the preferred embodiment is FFFF. At time $T_1$, the second pulse in the write signal loads the pulse counter 12 with its initial predetermined count, that is representative of the pulse of interest in the inverter drive logic signal. At time $T_2$, the third pulse in the write signal loads counter 10 with its initial count, which in the preferred embodiment is two. At time $T_3$, a pulse in start signal STL initiates the measurement sequence. When the first sync pulse in encountered at time $T_4$, counter 10 is activated to produce a logic low level output in the pulse count enable signal PCEL. This enables counter 12 to begin counting negative edges of the inverter drive logic signal. At time $T_7$, the pulse of interest is reached and the pulse width enable signal PWEL at the output of counter 12 goes to a logic low level. At time $T_8$, the next negative going edge of the inverter drive logic signal occurs and the pulse width enable signal returns to a logic high level.

Figure 3:
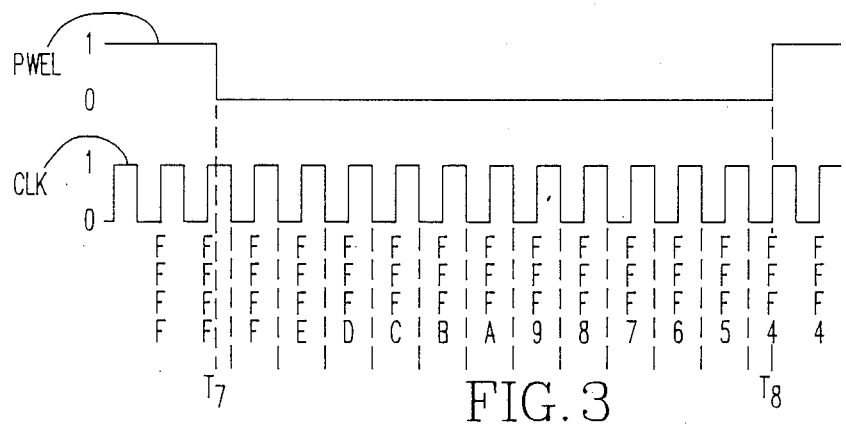

FIG. 3 shows the pulse width enable signal in an expanded time scale so that the high speed clock signal CLK can be illustrated along with the count values in counter 14. Note that the output count of counter 14 begins at FFFF and ends at FFF4. Returning to FIG. 2, at time $T_{11}$, the second sync pulse negative edge (beyond the initial sync pulse negative edge) is encountered. This deactivates counter 10, and disables any further operation of the pulse counter 12 and the pulse width counter 14. At this point, the entire circuit is disabled until the next start pulse is received. At time $T_{12}$, a pulse and read signal RDL is used to transfer the output count from counter 14 to the microprocessor in the inverter drive control circuit so that the duration of the pulse of interest can be calculated.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A method of measuring the duration of a selected pulse in a pulse train, said method comprising the steps of:
    loading a first down counter with a first predetermined initial count (N);
    loading a second down counter with a second predetermined initial count representative of a selected pulse in an inverter drive logic signal, the duration of which is to be measured, said second counter being activated by a first predetermined output count from said first counter;
    loading a third down counter with a third predetermined initial count, said third counter being activated by a second predetermined output count from said second counter;
    supplying a series of sync pulses to said first counter, said sync pulses occurring once for each pulse sequence of said inverter drive logic signal;
    supplying said inverter drive logic signal to said second counter;
    supplying a clock signal to said third counter;
    supplying a start pulse to said first counter, thereby enabling said first counter to count said sync pulses; and
    reading the output count of said third counter after (N+1) sync pulses following said start pulse, said third counter output count being representative of the duration of said selected pulse.

2. A method of measuring the duration of a selected pulse in a pulse train, as recited in claim 1, wherein N=2.

3. A method of measuring the duration of a selected pulse in a pulse train, as recited in claim 1, wherein said second predetermined output count equals zero and said first predetermined output count is in a range from zero to N.

4. A circuit for measuring the duration of a selected pulse in a pulse train, said circuit comprising:
    a first down counter for counting sync pulses, said sync pulses occurring once for each sequence of pulses in an inverter drive logic pulse train;
    a second down counter for counting pulses in said inverter drive logic pulse train, said second counter being activated by a first predetermined output count range from said first counter;
    a third down counter for counting clock pulses, said third counter being activated by a second predetermined output count from said second counter; and
    control means for loading said first down counter with a first predetermined initial count (N), for loading said second down counter with a second predetermined initial count representative of a selected pulse in said inverter drive logic signal, the duration of which is to be measured, for loading said third down counter with a third predetermined initial count, for supplying said sync pulses to said first counter, for supplying said inverter drive logic signal to said second counter, for supplying said clock signal to said third counter, for supplying a start pulse to said first counter, thereby enabling said first counter to count said sync pulses, and for reading the output count of said third counter after (N+1) sync pulses following said start pulse, said third counter output count being representative of the duration of said selected pulse.

5. A circuit for measuring the duration of a selected pulse in a pulse train, as recited in claim 4, wherein N=2.

6. A circuit for measuring the duration of a selected pulse in a pulse train, as recited in claim 4, wherein said second predetermined output count equals zero and said first predetermined output count is in the range of zero to two.

7. A method of measuring the duration of a selected pulse in a pulse train, said method comprising the steps of:
    using a first counter to produce a pulse count enable logic signal pulse in response to a start pulse, said pulse count enable logic signal pulse having a duration at least as long as two sequences of pulses in an inverter drive logic signal;
    using a second counter to count transition points in said inverter drive logic signal, said second counter being activated by said pulse count enable logic signal pulse, and counting down from a predetermined initial count representative of a pulse in said inverter drive logic signal, the duration of which is to be measured;
    using a third counter to count clock pulses, said third counter being activated by a predetermined output count of said second counter; and
    reading the output count of said third counter after said second counter goes beyond said predetermined output count, said third counter output count being representative of the duration of said selected pulse.

8. A circuit for measuring the duration of a selected pulse in a pulse train, said circuit comprising:
    a first counter for producing a pulse count enable logic signal pulse in response to a start pulse, said pulse count enable logic signal pulse having a duration at least as long as two sequences of pulses in an inverter drive logic signal;
    a second counter for counting transition points in said inverter drive logic signal, said second counter being activated by said pulse count enable logic signal pulse, and counting down from a predetermined initial count representative of a pulse in said inverter drive logic signal, the duration of which is to be measured;
    a third counter for counting clock pulses, said third counter being activated by a predetermined output count of said second counter; and
    means for reading the output count of said third counter after said second counter goes beyond said predetermined output count, said third counter output count being representative of the duration of said selected pulse.

* * * * *